(12) United States Patent
Matsui

(10) Patent No.: US 7,292,492 B2
(45) Date of Patent: Nov. 6, 2007

(54) SRAM, SEMICONDUCTOR MEMORY DEVICE, METHOD FOR MAINTAINING DATA IN SRAM, AND ELECTRONIC DEVICE

(75) Inventor: Noriyuki Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/523,586

(22) Filed: Sep. 20, 2006

(65) Prior Publication Data

US 2007/0035988 A1  Feb. 15, 2007

Related U.S. Application Data

(63) Continuation-in-part of application No. 11/249,377, filed on Oct. 14, 2005.

(30) Foreign Application Priority Data

Jul. 26, 2005  (JP)  ............................. 2005-216267
Jul. 20, 2006  (JP)  ............................. 2006-198497

(51) Int. Cl.
*G11C 11/41*   (2006.01)
*G11C 11/413*  (2006.01)
*G11C 11/406*  (2006.01)
*G11C 29/52*   (2006.01)
*G11C 7/02*    (2006.01)
*G11C 7/24*    (2006.01)
*G11C 7/04*    (2006.01)

(52) U.S. Cl. ...................... 365/222; 365/154; 365/200; 365/206

(58) Field of Classification Search ................ 365/222, 365/154, 200, 185.09, 185.02, 206
See application file for complete search history.

(56) References Cited

U.S. PATENT DOCUMENTS

| | | | | |
|---|---|---|---|---|
| 4,586,166 A * | 4/1986 | Shah | ........................... | 365/154 |
| 6,434,076 B1 * | 8/2002 | Andersen et al. | ........... | 365/222 |
| 6,440,790 B1 * | 8/2002 | Ishida | ........................ | 438/238 |
| 6,542,973 B2 * | 4/2003 | Hsu et al. | .................... | 711/104 |
| 6,560,156 B2 * | 5/2003 | Lien et al. | .................. | 365/222 |
| 6,700,827 B2 * | 3/2004 | Lien et al. | .................. | 365/222 |
| 6,738,282 B2 | 5/2004 | Jo | .............................. | 365/149 |
| 2003/0133321 A1 | 7/2003 | Jo | .............................. | 365/149 |

FOREIGN PATENT DOCUMENTS

JP  2002-343085  11/2002
JP  2003-208787  7/2003

\* cited by examiner

*Primary Examiner*—J. H. Hur
(74) *Attorney, Agent, or Firm*—Staas & Halsey LLP

(57) ABSTRACT

An SRAM (Static Ransom Access Memory) has a refreshing unit for performing a refreshing operation to maintain a state of an electric charge in a memory cell in order to prevent stored data from being destructed by a latch-up phenomenon to maintain the stored data certainly even when a soft error occurs due to a neutron.

17 Claims, 10 Drawing Sheets

SRAM, SEMICONDUCTOR MEMORY DEVICE, METHOD FOR MAINTAINING DATA IN SRAM, AND ELECTRONIC DEVICE

This application is a continuation-in-part application of Ser. No. 11/249,377, filed Oct. 14. 2005.

BACKGROUND OF THE INVENTION

1) Field of the Invention

The present invention relates to a technique for maintaining records of data in an SRAM (Static Random Access Memory).

2) Description of the Related Art

DRAMs (Dynamic Random Access Memories) store data with electric charges, but the electric charges decrease (leak out) with the passage of time. Accordingly, DRAMs require so-called refreshing by reading out data within a predetermined time period to restore the electric charge, in order to prevent the electric charge charged in a capacitor from leaking out.

To the contrary, SRAMs (Static Random Access Memory), which are nonvolatile memories, do not require refreshing.

As shown in FIG. 4, an SRAM cell (memory cell) 100 having six transistors includes a bistable latch, it thus does not require refreshing because the electric charge does not leak.

Meanwhile, an SRAM having a DRAM structure as disclosed in a patent document 1 below requires refreshing.

Heretofore known are soft errors caused by an alpha ray and a neutron occurring in DRAMs and SRAMs.

As the soft error caused by an alpha ray or a neutron, positive holes and electrons generated when the alpha ray passes through a silicon chip 101 dissipate an electric charge (an electric charge stored in a capacitor 102 in the drawing; for example, 40 to 50 fc) relating to storage of data to cause inversion of the data, as shown in FIG. 5. Incidentally, the silicon chip 101 shown in FIG. 5 is a DRAM.

Since the soft error caused by an alpha ray occurs instantly, it cannot be prevented. However, an effort to remove an alpha ray source involved in the package of an SRAM or DRAM has been made, which has reached a level in recent years where the soft error is overcome in practical use if the data is corrected with ECC (Error Checking and Correction; Error Correction code).

To the contrary, the soft error caused by a neutron in an SRAM or DRAM occurs in such a way that collision of the neutron with an atomic nucleus of silicon causes a nuclear reaction as shown in FIG. 5, which generates electrons and positive holes along its trajectory at this time. Such electrons and positive holes cause loss or inversion of the electric charge of the capacitor 102. Incidentally, an amount of electric charge generated by an alpha ray is approximately 16 fC/μm, whereas an amount of electric charge generated by a neutron is approximately 160 fC/μm, as shown in FIG. 5.

The soft error caused by a neutron cannot be prevented because it originates from cosmic rays, thus the soft error has been dealt with ECC as temporary measures.

It is generally said that the amount of neutrons reaching the ground in Tokyo is 11.66 to 8.42/cm² per hour.

The above-mentioned soft error caused by a neutron not only occurs in a single memory cell but also causes multi-bit error where electric charges of plural memory cells are lost, which often cannot be corrected with ECC.

As a result of verification of various experiments, the applicant of this application gave attention to differences in behavior between a soft error caused by a neutron and a soft error caused by an alpha ray in SRAMs. One of these is a latch-up phenomenon which never occurs in the soft error caused by an alpha ray because the energy of a neutron (that is, an amount of electric charge generated by a neutron) is large.

The latch-up phenomenon occurs because of a thyristor structure parasitically existing due to a CMOS (Complementary Metal Oxide Semiconductor) structure 103 in a memory cell of an SRAM configured as shown in FIG. 6. Unlike the soft error caused by an alpha ray, the latch-up phenomenon does not directly destruct stored data.

As shown in FIG. 7, in the CMOS structure 103 which is a memory cell structure of an SRAM, an NPN parasitic transistor Tr1, a PNP parasitic transistor Tr2 and diffused resistors R1 to R4 exist, by which a thyristor structure S shown in FIG. 8 is formed.

An electric charge generated by collision of a neutron with an atomic nucleus triggers the thyristor structure S to activate the same, which generates a current path between the power source (Vdd) and the ground of the thyristor structure S (that is, generates the latch-up phenomenon). This destructs the data, as a result.

More concretely, when electric current flows from the diffused resistor (hereinafter referred simply as a resistor) R2 to the resistor R4 due to collision of a neutron, for example, the parasitic transistor Tr1 is turned ON. Pulled by the electric current flowing from the resistor R2 to the resistor R4, electric current flows from the power source Vdd to the resistor R3, whereby the parasitic transistor Tr2 is turned ON. As a result, a path of the electric current flowing from the power source Vdd to the ground (denoted as "GND" in the drawing) through the parasitic transistor Tr2, the resistor R3 and the parasitic transistor Tr1 is established, whereby the electric current leaks.

This leaking electric current causes loss of the electric charge in the memory cell, causing destruction of the data.

Moreover, once a path between the power source Vdd and the ground is established, the leaking electric current keeps flowing. This causes destruction of data in not only a single cell but also other memory cells, which leads to a multi-bit error.

Unlike the soft error caused by an alpha ray, data destruction caused by the latch-up phenomenon does not occur instantaneously, but the latch-up phenomenon destructs data with a predetermined time constant because the thyristor structure parasitically exists because of the memory cell structure of an SRAM which involves the diffused resistors R1 through R4.

As above, the applicant of the present application found that the latch-up phenomenon, which cannot be corrected by ECC, destructs the data as the soft error due to a neutron in an SRAM, and clarified its mechanism.

[Patent Document] Japanese Unexamined patent application Publication Ser. No. 2003-208787

SUMMARY OF THE INVENTION

In the light of the above problems, an object of the present invention is to prevent stored data from being destructed by the latch-up phenomenon even when a soft error occurs due to a neutron in an SRAM, thereby to certainly maintain the stored data.

To attain the above object, an SRAM (Static Random Access Memory) storing data therein according to the present invention comprises a refreshing unit for performing a refreshing operation to maintain a state of an electric charge in a memory cell.

Preferably, the refreshing unit carries out the refreshing operation in order to prevent the data from being destructed due to a soft error caused by a neutron. Further, it is preferable that the refreshing unit carries out the refreshing operation at a shorter time interval than a data destruction time that is taken to destruct the data by latch-up of a thyristor structure which parasitically exists because of a structure of the memory cell and is activated by the neutron.

To attain the above object, the present invention further provides a semiconductor memory device comprising an SRAM (Static Random Access Memory) storing data therein, and a refreshing unit for performing a refreshing operation to maintain a state of an electric charge in a memory cell of the SRAM.

To attain the above object, the present invention still further provides a data maintaining method in an SRAM (Static Random Access Memory) storing data therein comprising the steps of performing a refreshing operation to maintain a state of an electric charge in a memory cell in order to prevent the data from being destructed due to a soft error caused by a neutron.

To attain the above object, the present invention still further provides an electronic device having an SRAM (Static Random Access Memory) for storing data comprising a refreshing unit for performing a refreshing operation to maintain a state of an electric charge in a memory cell of the SRAM.

It is preferable that the refreshing unit carries out the refreshing operation in order to prevent the data from being destructed due to a soft error caused by a neutron. Further, it is preferable that the refreshing unit carries out the refreshing operation at a shorter time interval than a data destruction time that is taken to destruct the data by latch-up of a thyristor structure which parasitically exists because of a structure of the memory cell and is activated by the neutron.

According to this invention, since the refreshing unit carries out the refresh operation (refreshing step) in an SRAM or an electronic device having an SRAM, it is possible to deactivate a thyristor structure, which parasitically exists because of a memory cell structure of the SRAM, to stop the latch-up phenomenon even when the latch-up phenomenon occurs due to a neutron. Even when a soft error occurs due to a neutron, it is possible to prevent stored data from being destructed by the latch-up phenomenon, thereby certainly maintaining the data retained in the memory cell.

Since the refreshing unit carries out the refreshing operation at a shorter time interval than the data destruction time that is taken to destruct the data by the latch-up of the thyristor structure, it is possible to prevent the data from being destructed and to maintain the data more certainly.

DESCRIPTION OF THE PREFERRED EMBODIMENTS

Hereinafter, description will be made of embodiments of the present invention with reference to the drawings.

[1] First Embodiment of the Invention

Figure 1:
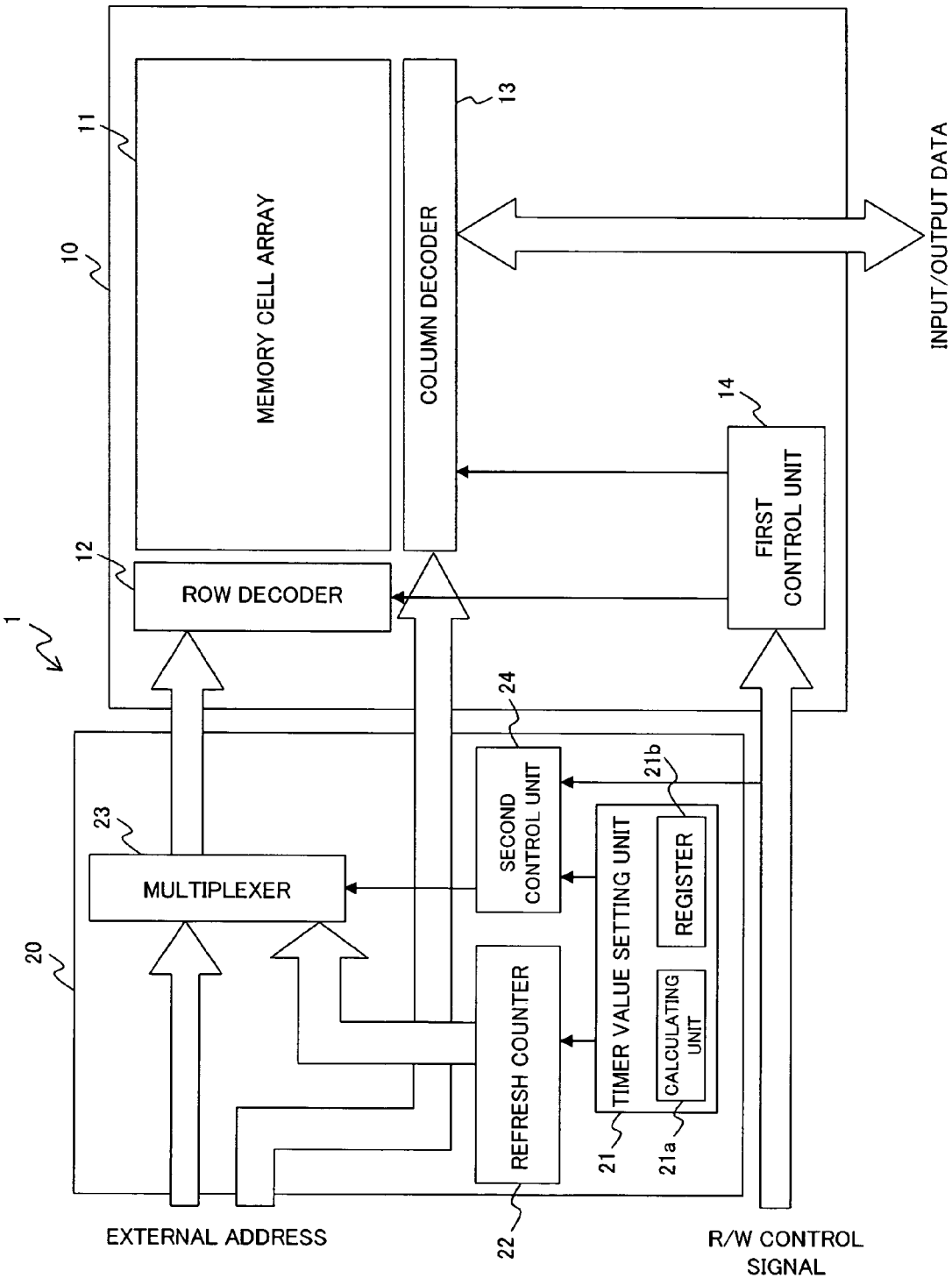
FIG. 1 is a block diagram showing a structure of a semiconductor memory device according to a first embodiment of this invention.

First, description will be made of a structure of a semiconductor memory device according to a first embodiment of this invention, with reference to a block diagram shown in FIG. 1. As shown in FIG. 1, a semiconductor memory device 1 comprises an SRAM (Static Random Access Memory) 10 and a refreshing unit 20.

The SRAM 10 comprises a memory cell array 11 for recording and retaining data, a row decoder 12, a column decoder 13 and a first control unit 14.

Figure 2:
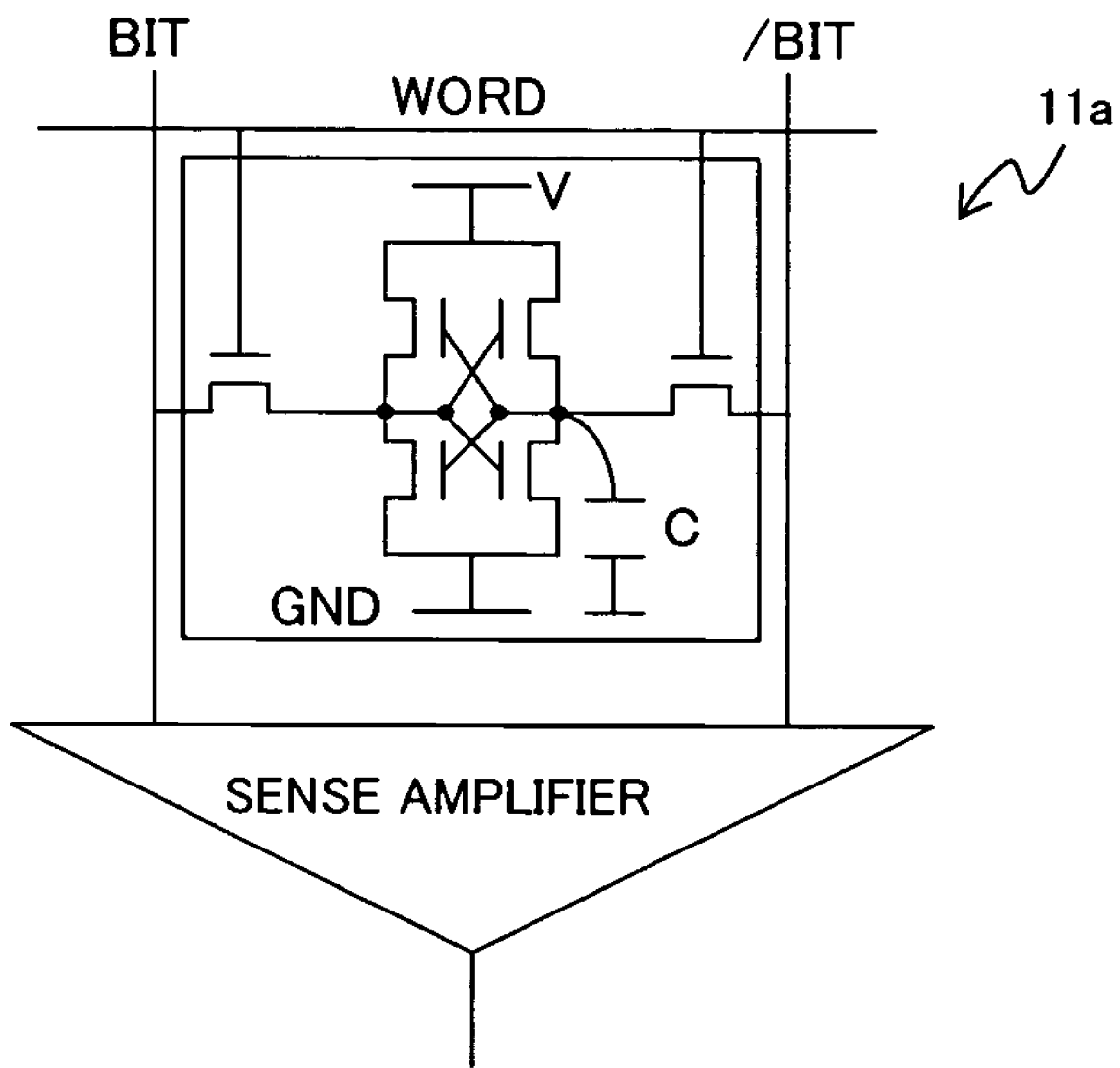
FIG. 2 is a diagram showing a structure of a memory cell of an SRAM of the semiconductor memory device according to the first embodiment of this invention.

The memory cell array 11 is a storage unit for storing data, which comprises a plurality of memory cells 11a having six transistors as shown in FIG. 2, for example. Each of the memory cells 11a retains data.

Reading of data from the memory cell 11a is performed by amplifying the voltage states of a bit line (denoted as "BIT" in the drawing) and a complement bit line (denoted as "/BIT" in the drawing) at the time that a word line is selected to provide electric conduction between the transistors.

The row decoder 12 decodes an address inputted from the outside to activate a specific row address in the memory cell array 11.

The column decoder 14 decodes an address inputted from the outside to implement inputting/outputting (READ/WRITE) of data by using a column address in a column activated by the column decoder 12.

The first control unit 14 receives a signal (CS; Chip Select) for selecting a chip, or a read signal (READ) or a write signal (WRITE) inputted from the outside, and generates an internal timing for carrying out a process corresponding to the received signal on the basis of the signal (denoted as "R/W control signal" in the drawing) to force the row decoder 12 or the column decoder 13 to carry out the process.

The refreshing unit 20 implements refreshing to maintain data stored in the memory cell array 11 (that is, a state of the electric charge in the memory cell 11a) of the SRAM 10.

Concretely, the refreshing unit 20 implements the refreshing by an operation of pseudo-reading of data from each memory cell 11a of the memory cell array 11, thereby preventing the data from being destructed due to a soft error caused by a neutron.

Namely, the refreshing unit 20 implements the refreshing to turn the thyristor off, thereby preventing the data from being destructed due to latch-up.

The refreshing unit 20 comprises a timer value setting unit 21, a refresh counter 22, a multiplexer 23 and a second control unit 24.

The timer value setting unit 21 sets and retains a fixed cycle (time interval) to refresh the memory cell array 11 of the SRAM 10. The timer value setting unit 21 comprises a calculating unit 21a for calculating a cycle to refresh, and a register 21b for retaining the cycle calculated by the calculating unit 21a.

Figure 6:
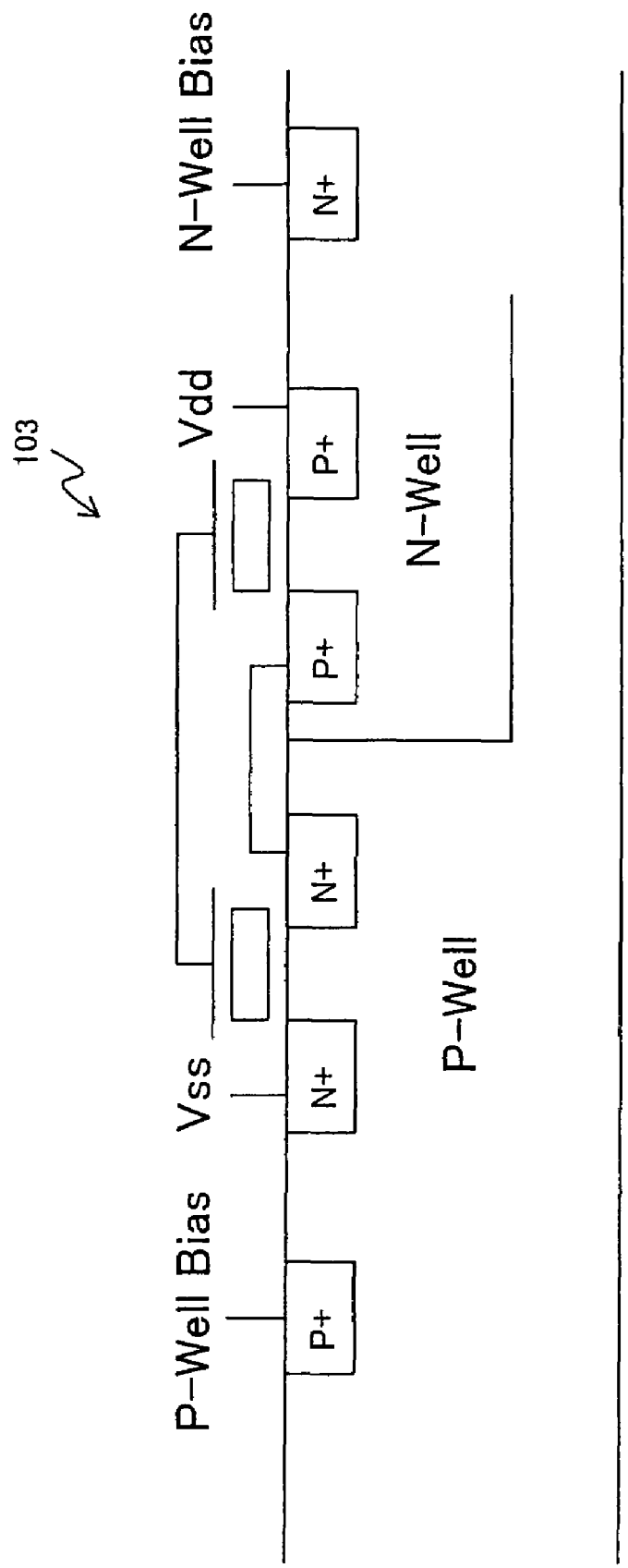
FIG. 6 is a diagram showing a CMOS structure of a known SRAM.
Figure 7:
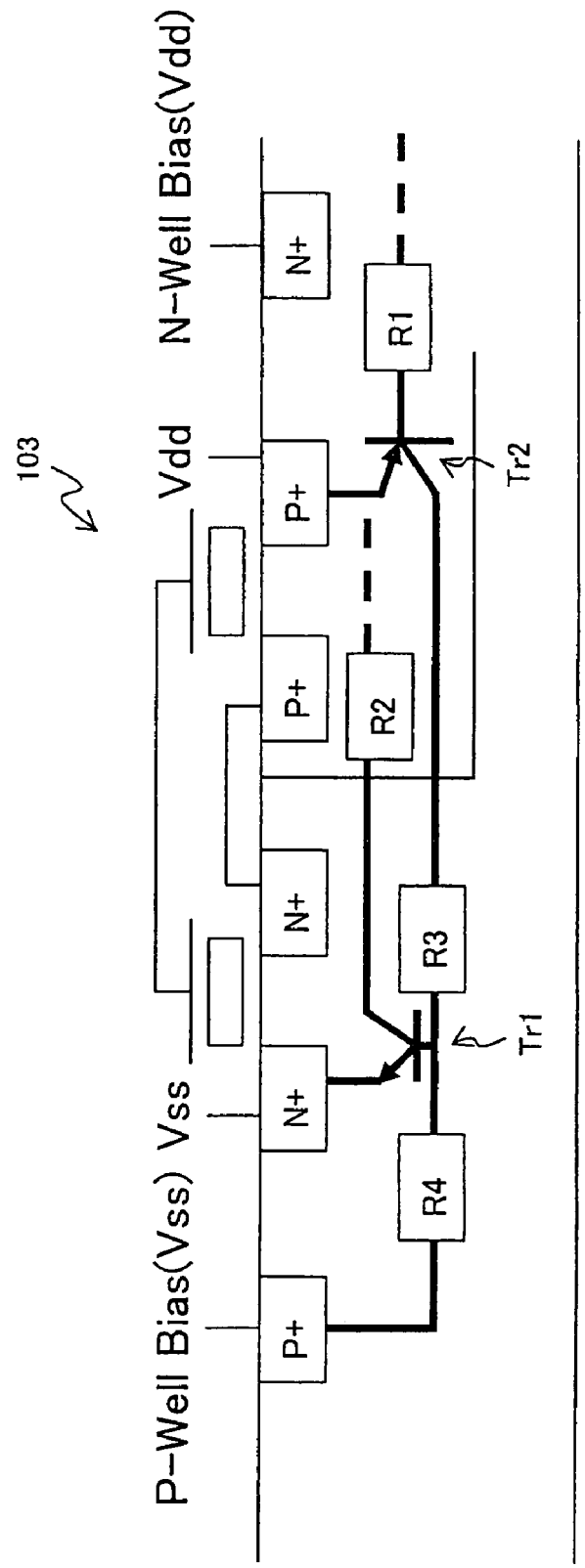
FIG. 7 is a diagram for illustrating a thyristor structure which parasitically exists because of the CMOS structure shown in FIG. 6.
Figure 8:
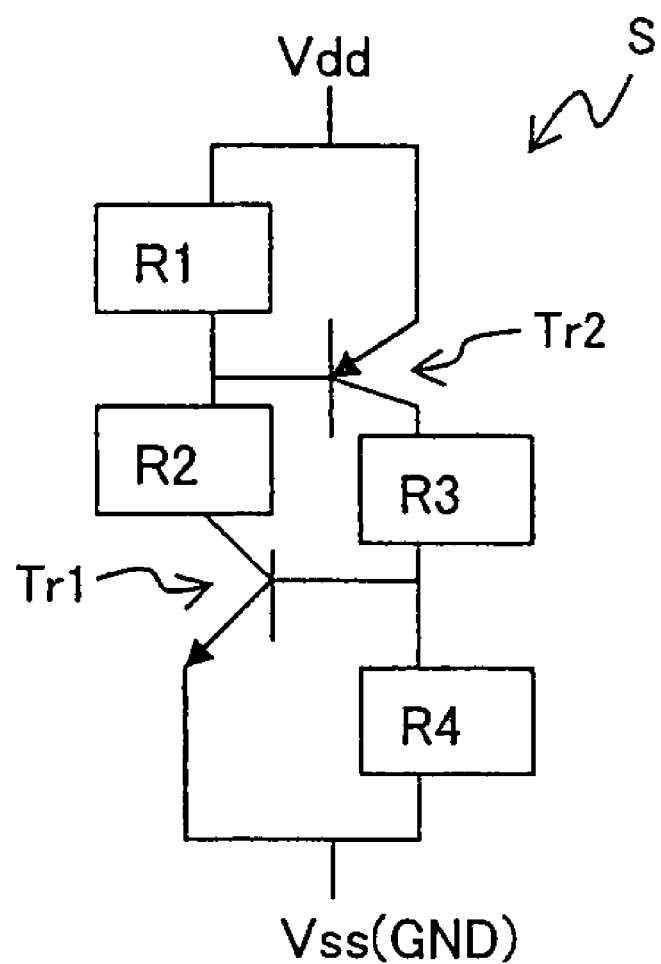
FIG. 8 is a diagram showing the thyristor structure which parasitically exists because of the CMOS structure shown in FIG. 6.

The calculating unit 21a calculates a period (time constant; data destruction time) required to destruct the data in the memory cell 11a due to latch-up of the thyristor structure (refer to the thyristor structure S in FIG. 8 mentioned above) activated by a neutron, which parasitically exists because of the CMOS structure (refer to the CMOS structure 103 in FIG. 6 mentioned above) of the memory cell 11a shown in FIG. 2, and lets the register 21b retain a shorter time interval (cycle) than the calculated data destruction time as a time interval to refresh.

Now, description will be made of a method for calculating the data destruction time by the calculating unit 21a. The calculating unit 21a calculates the data destruction time on the basis of a node capacity C (refer to FIG. 2) of the memory cell 11a retaining the data and a resistance value R of the diffused resistor R3 through which the leakage current I passes when the latch-up occurs in the thrystor structure S shown in FIG. 8 mentioned above.

The stored electric charge Q can be given in terms of a source voltage V and a node capacity C by the following equation (1).

$$Q=CV \qquad (1)$$

On the other hand, the stored electric charge Q can be given as an integral value of the leakage current I due to the latch-up phenomenon in the thyristor structure S by the following equation (2).

$$Q=\int Idt \qquad (2)$$

By replacing "∫dt" with "T" in the equation (2), the following equation (3) can be obtained. Accordingly, "T" can be considered to express the data destruction time.

$$Q=IT \qquad (3)$$

According to the above equations (1) and (3), the following equation (4) is established.

$$CV=IT \qquad (4)$$

Since the leakage current I can be given in terms of a resistance value R of the diffused resistor R3 by the following equation (5), the following equation (6) can be obtained by substituting the following equation (5) in the above equation (4).

[Equation 1]

$$I = \frac{V}{R} \qquad (5)$$

-continued $$CV = \frac{V}{R}T \qquad (6)$$

By solving the equation (6) for the data destruction time T, the following equation (7) can be obtained. The calculating unit 21a calculates the data destruction time T on the basis of the following equation (7).

$$T=CR \qquad (7)$$

The refresh counter 22 is a counter for designating an address of a memory cell 11a to be refreshed. The refresh counter 22 outputs a relevant address to the multiplexer 23 at time intervals (namely, time intervals calculated by the calculating unit 21a and retained in the register 21b) set by the timer value setting unit 21.

The refresh counter 22 increments the address each time the refresh counter 22 outputs an address, thereby refreshing each and every memory cell 11a of the memory cell array 11 of the SRAM 10 in order.

The multiplexer 23 selects either an address for accessing (for example, writing or reading of data) to the SRAM 10 inputted from the outside or an address outputted from the refresh counter 22, and outputs the selected address. Namely, the multiplexer 23 switches an address (external address) for accessing to the SRAM 10 to an address for refreshing (that is, an address for implementing a pseudo-reading operation as refreshing), or vice versa. The multiplexer 23 is controlled by the second control unit 24 to implement this switching.

The second control unit 24 controls, on the basis of an R/W control signal from the outside, the multiplexer 23 to select an external address for accessing to the SRAM 10, while controlling, on the basis of the fixed cycle (a shorter time interval than the data destruction time) retained in the register 21b of the timer value setting unit 21, the multiplexer 23 to select an address for refreshing when it comes time to refresh.

In the semiconductor memory device 1, the SRAM 10 carries out a normal read/write process or the refreshing operation according to an address outputted from the multiplexer 23 of the refreshing unit 20. Since an address for refreshing is periodically outputted from the multiplexer 23 on the basis of the time intervals retained in the register 21b of the timer value setting unit 21, the refreshing is carried out at predetermined time intervals.

As above, in the semiconductor memory device 1 (in a data maintaining method in the SRAM 10) according to the first embodiment of this invention, the refreshing unit 20 carries out the refreshing operation (refreshing step) of the SRAM 10. Accordingly, even when the latch-up phenomenon occurs due to a neutron in the thyristor structure parasitically existing because of the memory cell structure (CMOS structure) of the SRAM 10, it is possible to deactivate (turn off) the thyristor structure to stop the latch-up phenomenon. Even when a soft error due to a neutron occurs, it is possible to prevent the stored data from being destructed by the latch-up phenomenon, thereby to certainly maintain the data retained in the memory cell array 11.

The calculating unit 21a (calculating step) of the timer value setting unit 21 of the refreshing unit 20 calculates the data destruction time that is taken to destruct the data by the latch-up in the thyristor structure, and the register 21b retains a shorter time interval than the calculated data destruction time as the refresh cycle. Accordingly, the refreshing unit 20 can periodically carry out refreshing of the SRAM 10 at a shorter time interval than the data destruction time, thereby avoiding data destruction and maintaining the data, certainly.

[2] Second Embodiment of the Invention

Next, description will be made of a structure of an SRAM according to a second embodiment of this invention, with reference to a block diagram shown in FIG. 3. Incidentally, like reference characters in FIG. 3 designate like or corresponding parts in FIGS. 1 and 2, detailed descriptions of which are thus omitted.

Figure 3:
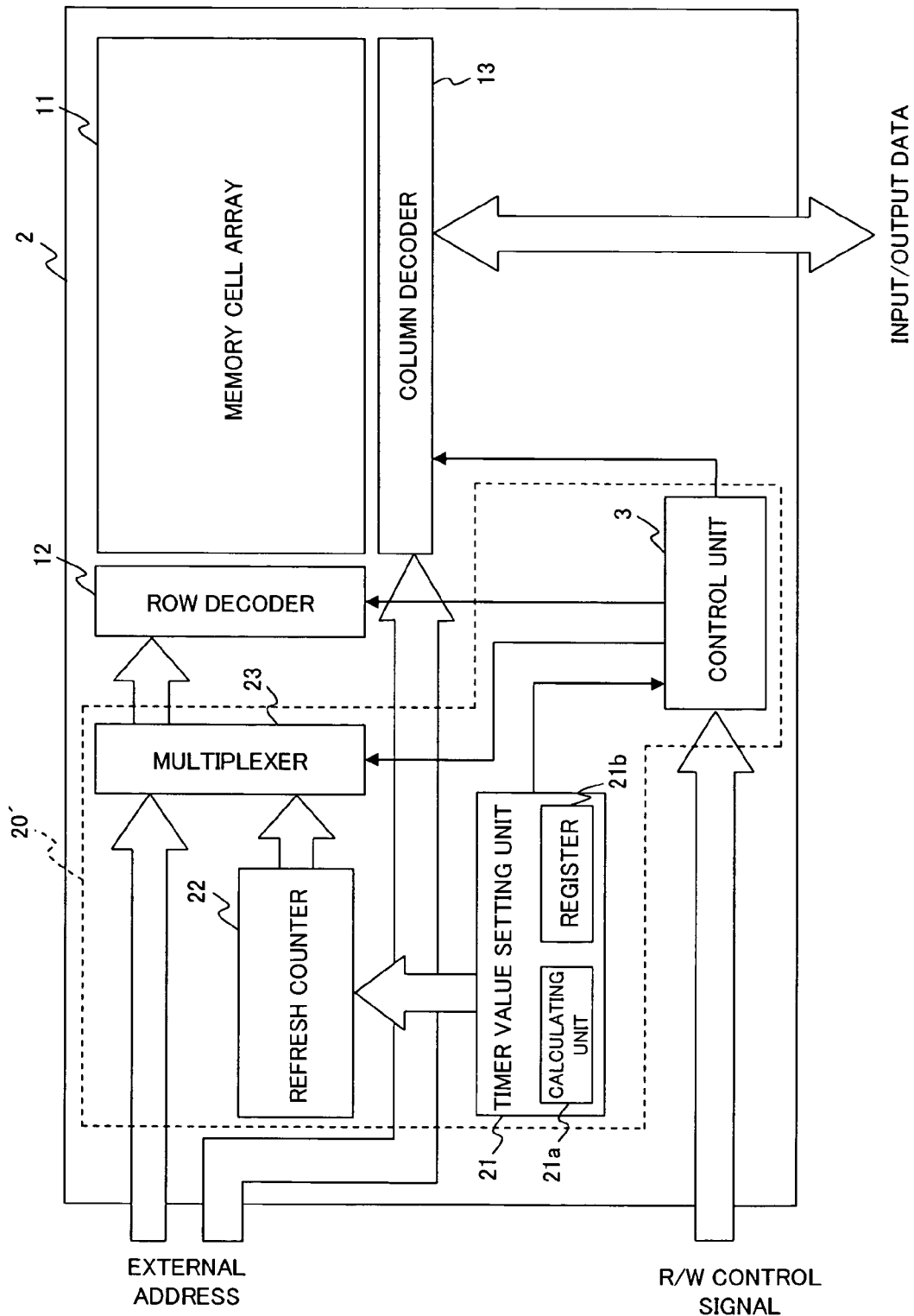
FIG. 3 is a block diagram showing a structure of an SRAM according to a second embodiment of this invention.
Figure 4:
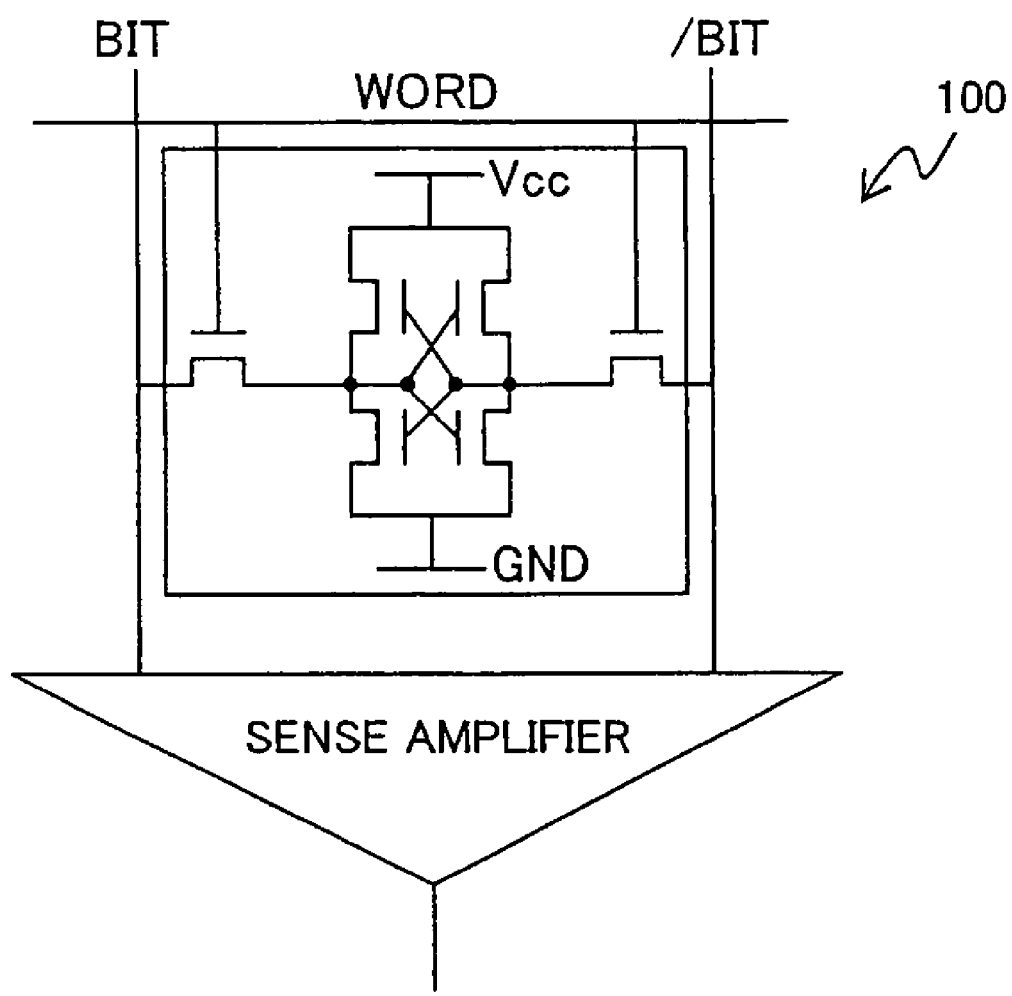
FIG. 4 is a diagram showing a structure of a memory cell having six transistors of a known SRAM.
Figure 5:
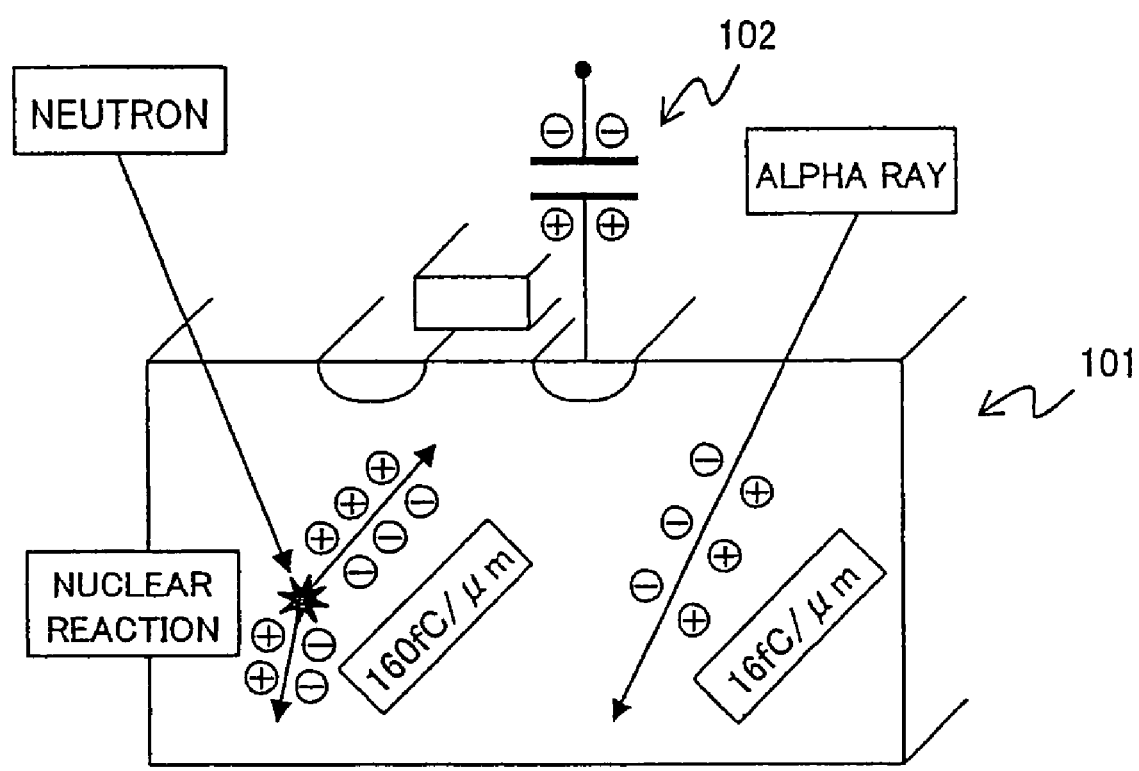
FIG. 5 is a diagram for illustrating soft errors caused by an alpha ray and a neutron.

As shown in FIG. 3, an SRAM 2 has a refreshing unit 20' in its inside. In contrast to the semiconductor memory device 1 according to the first embodiment described above with reference to FIG. 1 where the refreshing unit 20 is provided outside the SRAM 10, which is of an external control type, this SRAM 2 is of a built-in type.

A memory cell array 11, a row decoder 12, a column decoder 13, a timer value setting unit 21, a refresh counter 22 and a multiplexer of this SRAM 2 are the same as those of the semiconductor memory device 1 according to the first embodiment. This SRAM 2 differs from the semiconductor memory device 1 in that a control unit 3 has functions of both of the first control unit 14 and the second control unit 24 of the semiconductor memory device 1 according to the first embodiment.

As shown in FIG. 3, the timer value setting unit 21, the refresh counter 22, the multiplexer 23 and the control unit 3 together function as the refreshing unit 20' in this SRAM 2.

The SRAM 2 according to the second embodiment of this invention can provide the similar working effects as those provided by the semiconductor memory device according to the first embodiment.

[Others]

Note that the present invention is not limited to the above examples, but may be modified in various ways without departing from the scope of the invention.

In the above embodiments, the memory cell array 11 in the SRAM 10 or 20 has a plurality of the memory cells 11a each having six transistors. However, this invention is not limited to this example. The present invention may be applied so long as the memory cell array of the SRAM has a memory cell having at least the CMOS structure, or a memory cell having a structure in which the thyristor structure parasitically exists.

In the above embodiments, the calculating unit 21a is provided in the timer value setting unit 21. However, this invention is not limited to this example. Without the calculating unit 21a, the timer setting unit 21 may set a time interval based on the data destruction time calculated outside to the register 21b.

Figure 9:
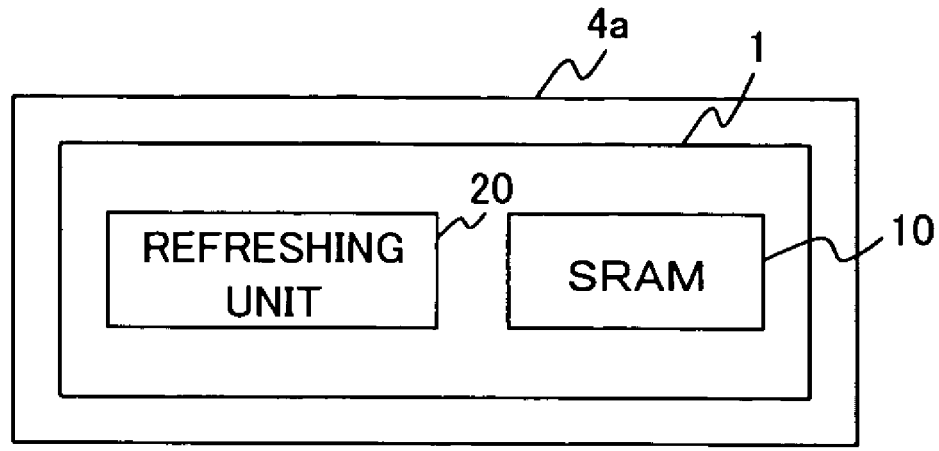
FIG. 9 is a block diagram showing a structure of an electronic device on which the semiconductor memory device according to the first embodiment of this invention is mounted.
Figure 10:
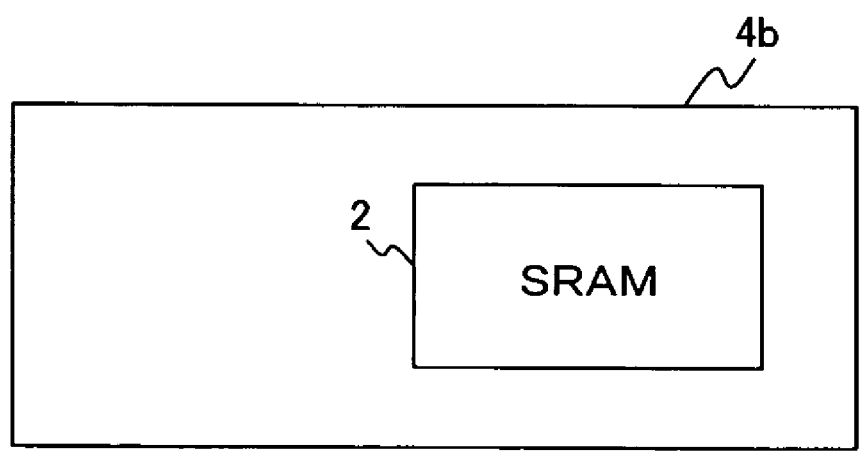
FIG. 10 is a block diagram showing a structure of an electronic device on which the SRAM according to the second embodiment of this invention is mounted.

Further, the semiconductor memory device 1 (that is, the SRAM 10 and the refreshing unit 20) according to the first embodiment of this invention described above is provided in an electronic device 4a, as shown in FIG. 9. The SRAM 2 according to the second embodiment is provided in an electronic device 4b, as shown in FIG. 10.

Note that the electronic devices 4a and 4b having the semiconductor memory device 1 and the SRAM 2, respectively, according to this invention are not limited in this invention. As the electronic devices 4a and 4b, adoptable are various processing devices (for example, personal computers, servers, etc.) and electronic parts (chips, etc.), which carry out processes using at least the semiconductor memory device 1 or the SRAM 2.

Figure 11:
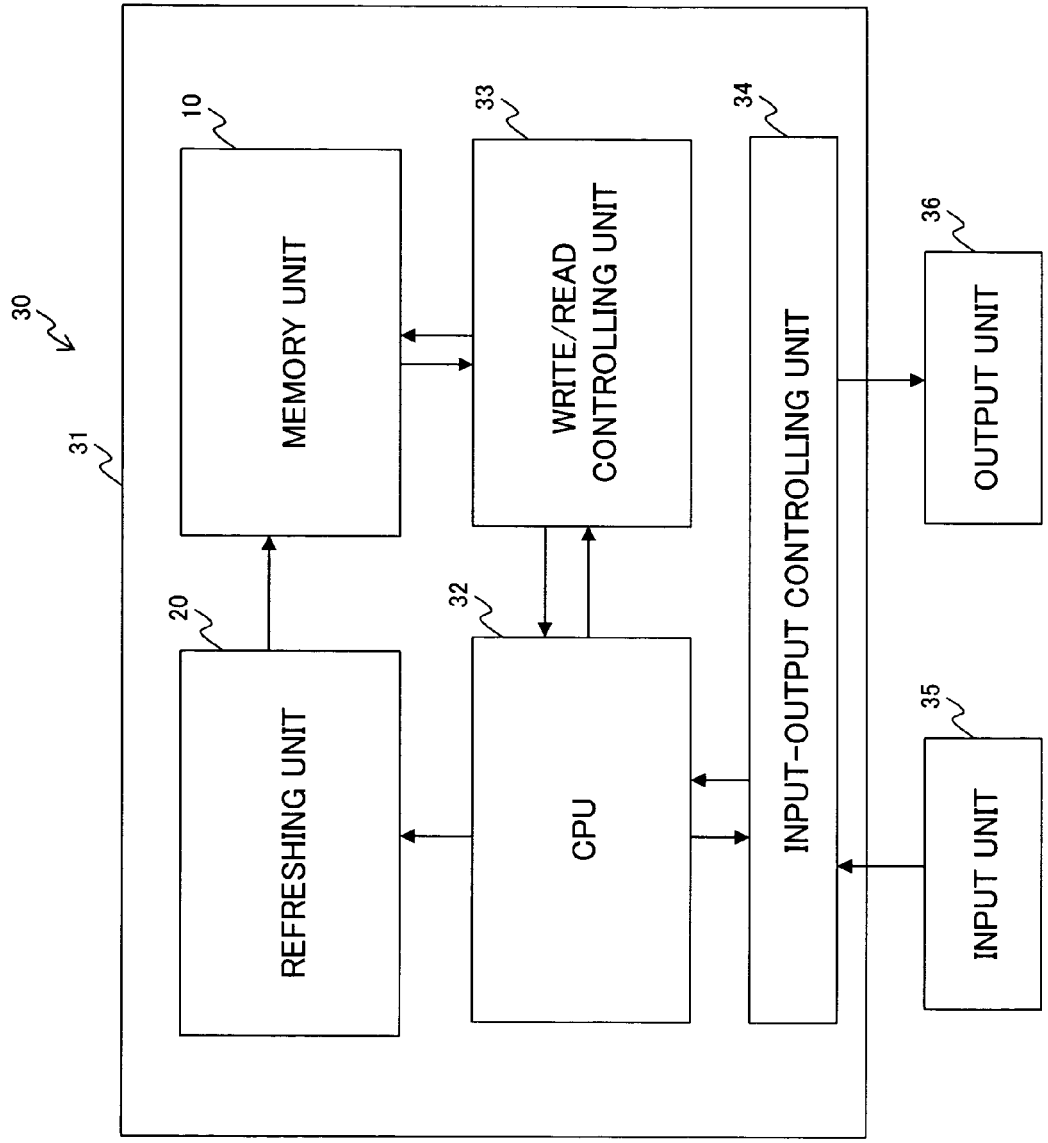
FIG. 11 is a block diagram showing a structure of a processing system having the semiconductor memory device according to the first embodiment of this invention.

More concretely, as shown in FIG. 11, for example, an information processing device 31 as being an electronic device constituting a processing system 30 comprises a memory unit (SRAM) 10 for storing data, and a refreshing unit 20 for performing the refreshing operation to maintain the state of electric charge in a memory cell of the memory unit 10.

The processing system 30 has an input unit 35 and an output unit 36, in addition to the information processing device [for example, a logic LSI (Large Scale Integration)] 31. The information processing device 31 has a CPU (Central Processing Unit) 32, a write/read controlling unit 33 and an input-output controlling unit 34, in addition to the memory unit 10 and the refreshing unit 20 mentioned above.

The CPU 32 carries out processes by using data retained the memory unit 10, for example. The write/read controlling unit 33 controls write/read of data to/from the memory unit 10, in association with the CPU 32 (or under control of the CPU 32). The input-output controlling unit 34 controls input from the input device 35 or output to the output device 35.

What is claimed is:

1. An SRAM (Static Random Access Memory) storing data therein comprising:
    a refreshing unit performing a refreshing operation to maintain a state of an electric charge in a memory cell at a shorter time interval than a data destruction time that is taken to destruct the data by latch-up of a thyristor structure which parasitically exists because of a structure of said memory cell and is activated by a neutron.

2. The SRAM according to claim 1, wherein said refreshing unit calculates the data destruction time on the basis of a node electric charge of said memory cell retaining the data and a resistance value of a resistor through which a leakage current passes in the thyristor structure.

3. The SRAM according to claim 2, wherein said refreshing unit periodically carries out the refreshing operation on the basis of the data destruction time.

4. The SRAM according to claim 1, wherein said refreshing unit periodically carries out the refreshing operation on the basis of the data destruction time.

5. A semiconductor memory device comprising:
    an SRAM (Static Random Access Memory) storing data therein; and
    a refreshing unit performing a refreshing operation to maintain a state of an electric charge in a memory cell of said SRAM at a shorter time interval than a data destruction time that is taken to destruct the data by latch-up of a thyristor structure which parasitically exists because of a structure of said memory cell and is activated by a neutron.

6. The semiconductor memory device according to claim 5, wherein said refreshing unit calculates the data destruction time on the basis of a node electric charge of said memory cell retaining the data and a resistance value of a resistor through which a leakage current passes in the thyristor structure.

7. The semiconductor memory device according to claim 6, wherein said refreshing unit periodically carries out the refreshing operation on the basis of the data destruction time.

8. The semiconductor memory device according to claim 5, wherein said refreshing unit periodically carries out the refreshing operation on the basis of the data destruction time.

9. A data maintaining method in an SRAM (Static Random Access Memory) storing data therein, comprising:

performing a refreshing operation to maintain a state of an electric charge in a memory cell in order to prevent the data from being destructed due to a soft error caused by a neutron at a shorter time interval than a data destruction time that is taken to destruct the data by latch-up of a thyristor structure which parasitically exists because of a structure of said memory cell and is activated by the neutron.

10. The data maintaining method in an SRAM according to claim 9 further comprising:

calculating the data destruction time on the basis of a node electric charge of said memory cell retaining the data and a resistance value of a resistor through which a leakage current passes in said thyristor structure.

11. The data maintaining method in an SRAM according to claim 10, wherein, at said refreshing, the refreshing operation is periodically carried out on the basis of the data destruction time.

12. The data maintaining method in an SRAM according to claim 9, wherein, at said refreshing, the refreshing operation is periodically carried out on the basis of the data destruction time.

13. An electronic device having an SRAM (Static Access Memory) for storing data comprising:

a refreshing unit performing a refreshing operation to maintain a state of an electric charge in a memory cell of said SRAM at a shorter time interval than a data destruction time that is taken to destruct the data by latch-up of a thyristor structure which parasitically exists because of a structure of said memory cell and is activated by a neutron.

14. The electronic device according to claim 13, wherein said refreshing unit calculates the data destruction time on the basis of a node electric charge of said memory cell retaining the data and a resistance vale of a resistor through which a leakage current passes in the thyristor structure.

15. The electronic device according to claim 14, wherein said refreshing unit periodically carries out the refreshing operation on the basis of the data destruction time.

16. The electronic device according to claim 13, wherein said refreshing unit periodically carries out the refreshing operation on the basis of the data destruction time.

17. A data storing device comprising:

a refreshing unit performing a refreshing operation to maintain a state of an electric charge in a memory cell at a shorter time interval than a data destruction time that is taken to destruct the data by latch-up of a thyristor structure which parasitically exists because of a structure of said memory cell and is activated by a neutron.

* * * * *

UNITED STATES PATENT AND TRADEMARK OFFICE
CERTIFICATE OF CORRECTION

PATENT NO.         : 7,292,492 B2
APPLICATION NO. : 11/523586
DATED              : November 6, 2007
INVENTOR(S)        : Noriyuki Matsui It is certified that error appears in the above-identified patent and that said Letters Patent is hereby corrected as shown below:

On the title Abstract Item (57)
Line 1, delete "Ransom" and insert --Random--, therefor.

Col. 9, line 23, claim 13 after "Static" insert --Random--.

Col. 10, line 9, claim 14 delete "vale" and insert --value--, therefor.

Signed and Sealed this

Twenty Second Day of April, 2008

JON W. DUDAS
*Director of the United States Patent and Trademark Office*